United States Patent [19]

Goodwin

[11] Patent Number: 5,537,028
[45] Date of Patent: Jul. 16, 1996

[54] ELECTRICITY METER AND METHOD FOR MEASURING APPARENT POWER

[75] Inventor: R. Wendell Goodwin, Dunwoody, Ga.

[73] Assignee: Schlumberger Industries, Inc., Norcross, Ga.

[21] Appl. No.: 228,630

[22] Filed: Apr. 18, 1994

Related U.S. Application Data

[63] Continuation of Ser. No. 208,209, Mar. 10, 1994, abandoned.

[51] Int. Cl.$^6$ ........................................ G01R 7/00
[52] U.S. Cl. ........................................ 324/141; 324/142
[58] Field of Search .................... 364/483; 324/141, 324/142, 116, 107, 76–82

[56] References Cited

U.S. PATENT DOCUMENTS 4,174,499  11/1979  Waurick ................................. 324/142
5,124,624  6/1992  de Vries ................................. 324/142

OTHER PUBLICATIONS

"Electronic Devices + Circuits" M. S. Ghausi p. 239 CBS College Publishing 1985.
"The Art of Electronics" Paul Horowitz p. 625 Cambridge Univ. Press 1989.

Primary Examiner—Ernest F. Karlsen
Assistant Examiner—Russell M. Kobert
Attorney, Agent, or Firm—K. G. W. Smith

[57] ABSTRACT

An electricity meter and method for measuring VA power consumption. The electricity meter comprises a transducer circuit receiving line current and line voltage and producing a first signal corresponding to active power on the line, and a level shifting circuit responsive to the first signal for producing a second signal corresponding to apparent power.

6 Claims, 3 Drawing Sheets

5,537,028

ELECTRICITY METER AND METHOD FOR MEASURING APPARENT POWER

This application is a continuation of application Ser. No. 08/208/209, filed Mar. 10, 1994, now abandoned.

BACKGROUND

1. Field of the Invention

This invention relates generally to electricity meters and methods for measuring apparent power consumption, and more particularly to a novel electricity meter and method that measures both active power and apparent power.

2. Description of the Background

Until recently, the cost of electric power has been based on the so-called integrated active power (the product of voltage across a branch of an AC circuit and the component of the electric current that is in phase with the voltage) supplied to a customer measured in kilowatt-hours. However, the capacity of an electrical power system, which dictates the capital investment of electric power utility must make in generators, transformers, etc. depends on the apparent power (product of RMS current and RMS voltage without consideration of the effects of phase angle) it must supply. Since the average power factor of a customer usually is less than unity due, for example, to the presence of large reactive loads, the active power will be less than the apparent power. Hence, active power based revenue from a consumer will not necessarily reflect the utility's investment in equipment to serve that customer.

Public Service Commissions in several states and in Canada accordingly have allowed the utilities either to impose a surcharge based on the mismatch between apparent power and active power, or bill the consumer entirely on the apparent power.

Heretofore, metering of apparent power has generally been achieved by monitoring line current and line voltage, and multiplying the RMS values of current and voltage electronically. If separate transformers are used to monitor the line current and line voltage, the cost of the meter increases. Hall effect transducers are relatively inexpensive and have been used by power utility companies to provide economical watt transducers. However, such Hall effect transducers were not considered to be versatile enough to be used in a watt-hour meter. Therefore, a substantial reduction in cost can be achieved if Hall effect transducers can be used to meter both active power and apparent power.

SUMMARY OF THE INVENTION

An advantage of the invention is in providing an improvement in electricity meters for measuring power.

Another advantage of the invention is measuring apparent power without RMS current and voltage multiplication.

Still another advantage is measuring apparent power by inexpensive modification of circuitry for measuring active power.

The above and other advantages of this invention are achieved, at least in part by an electricity meter for measuring both active power and apparent power, comprising a transducer circuit receiving line current and line voltage and producing a first signal corresponding to active power on the line, and a circuit responsive to the first signal for producing a second signal corresponding to apparent power. Preferably, the transducer circuit includes a Hall watt transducer. In a preferred embodiment, the circuit for producing the second signal corresponding to apparent power is a level shifting circuit comprising a summing circuit having an input and output, and first and second operational amplifier circuits connected in series between the input and output of the summing circuit. The first operational amplifier is an ideal diode which senses the negative portion of the power curve and its output is integrated by the second operational amplifier to provide a signal to the summing circuit.

In accordance with a particular aspect of the invention, the meter comprises a transducer receiving line current and line voltage and providing a first signal proportional to active power. A level shifting circuit connected to receive the output of the transducer provides a level shifted signal, and a pulse providing means connected to receive the level shifted signal from the level shifting circuit develops pulse output signals. Connected to the output of the pulse providing means is a pulse accumulator for accumulating the pulse signals provided by the pulse providing means. The accumulated pulse signals of the pulse accumulator correspond to apparent energy.

In a particular embodiment, the level shifting circuit comprises a closed loop including a summing means having an input and output, and first and second operational amplifier circuits connected in series between the input and output of the summing means. The closed loop functions to shift the power curve upward until its minimum value is zero. The shifted waveform is averaged and converted to pulses.

In accordance with another aspect of the invention, a method of measuring VA power consumed on a power line comprises receiving voltage and current on the power line and producing a signal corresponding to active power then converting the active power signal to a signal corresponding to apparent power. Converting the active power signal to a signal corresponding to apparent power includes level shifting the active power signal and averaging the level-shifted signal.

BEST MODE FOR PRACTICING THE INVENTION

Figure 1:
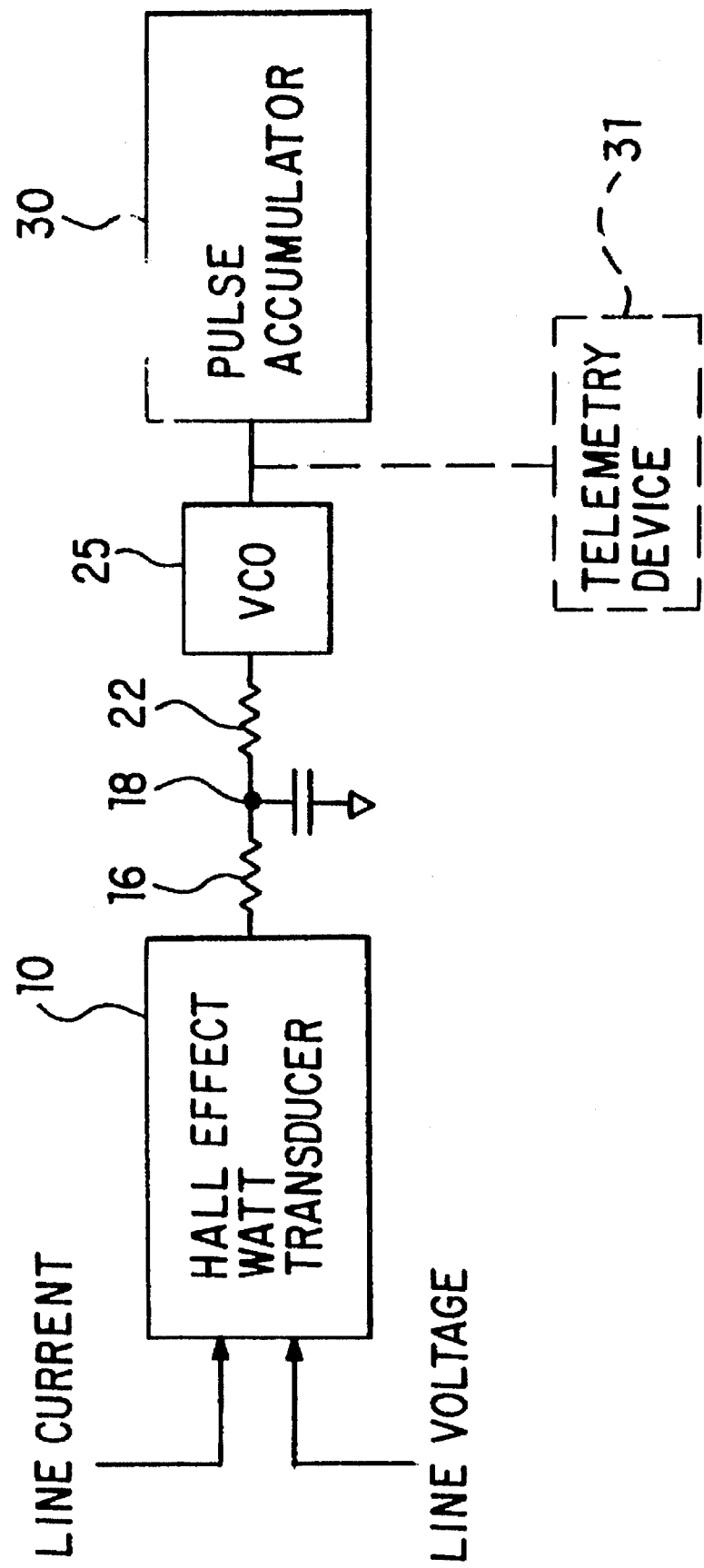
FIG. 1 is a diagram showing a structure of a conventional electricity meter for measuring active power with Hall effect circuitry.
Figure 3A:
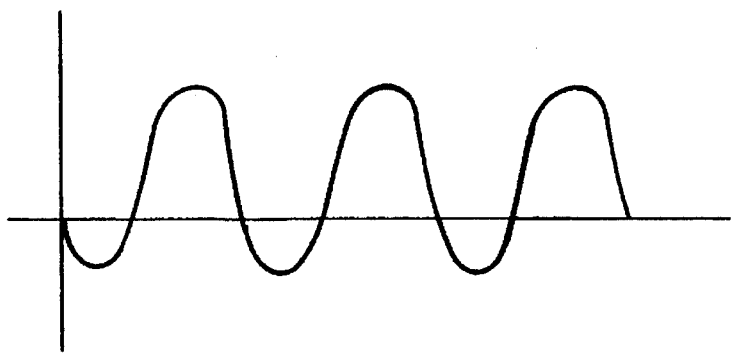
FIGS. 3a to 3d are signal waveform diagrams showing the waveforms at different portions of the electricity meters of FIGS. 1 and 2.

Reference is made to FIG. 1 which depicts an electricity meter for measuring active power using Hall effect circuitry. In FIG. 1, a Hall effect watt transducer 10 is connected to receive line current and line voltage. As is well known, the output of a planar Hall element is proportional to the product of its excitation current and the flux density perpendicular to its surface. If the excitation is made proportional to line voltage and the flux density proportional to line current (by use of a gapped magnetic core), the Hall output is a signal proportional to power which has a waveform as shown in FIG. 3a. This signal from the Hall effect watt transducer 10 is applied through resistor 16 to node 18 which is connected to resistor 22 through capacitor 20. Capacitor 20 is also connected to ground. Resistors 16 and 22, and capacitor 20 comprise an averaging circuit the output of which is input to voltage controlled oscillator (VCO) 25. The output of VCO 25 is connected to pulse accumulator 30 which accumulates the pulses produced by VCO 25. These accumulated pulses represent active energy in watt-hours. Alternatively, the pulses from VCO 25 can be sent to a telemetry device 31 for transmitting the pulses to a remote location for accumulation and billing purposes. Telemetry device 31, being conventional, is not described in detail herein.

A feature of the present invention is based upon the realization that it is possible to derive apparent power from active power without necessitating multiplication of RMS values of current and voltage carried out in the prior art. This realization can be better appreciated with reference to the following equations describing a single-phase system having no harmonics.

$$\text{ACTIVE POWER: } P = \frac{IV\cos\phi}{2} \text{ (watts)}$$

$$\text{REACTIVE POWER: } Q = \frac{IV\sin\phi}{2} \text{ (vars)}$$

APPARENT POWER $S = V_{rms} I_{rms}$ (volt-amps or VA's)
$S^2 = P^2 + Q^2$
POWER FACTOR $K = \cos\phi$
where:
$V \equiv$ peak line voltage (volts)
$I \equiv$ peak line current (amps)
$\phi \equiv$ angle between voltage and current The characteristics of the load presented by a power consumer are of two types:
RESISTIVE (resistive only)
REACTIVE (inductive and/or capacitive as well as resistive components)

For resistive loads, $\phi=0$, $K=1$, REACTIVE POWER=0, and hence, ACTIVE POWER=APPARENT POWER For reactive loads, $\phi$ is non-zero, $-0.5 < K < +0.5$ for most cases, REACTIVE POWER is finite and hence, ACTIVE POWER $\neq$ APPARENT POWER.

If the instantaneous values of voltage and current are
$V(t) = V\sin(\omega t - \phi)$ and $I(t) = I\sin\omega t$
Then the Hall output will be:
$P(t) = KIV\sin\omega t(\sin(\omega t - \phi)) = KIV(\sin^2\omega t\cos\phi - \sin\omega t\cos\omega t\sin\phi)$
where K=a constant.

P(t) is the instantaneous active power. The average value of P(t) is $$\frac{IV\cos\phi}{2}.$$

(For $\phi=0$, the average value of P(t is $$\frac{IV}{2}$$

which is apparent power.)

For finite $\phi$, P(t) has positive and negative values. However, if P(t) is shifted vertically so that its minimum value is zero, the average value of P (t) will also be "apparent power" which is shown as follows.
Let $S(t) = P(t)/K$, then $$S(t) = P(t) - \left[\frac{\cos\phi - 1}{2}\right] =$$

$$IV\left(\sin^2\omega t\cos\phi - \sin\omega t\cos\omega t\sin\phi - \left(\frac{\cos\phi - 1}{2}\right)\right)$$

Finding the average value of S(t) is as follows:

$$\overline{S(t)} = \frac{IV}{2\pi}\int_0^{2\pi}\left(\sin^2\omega t\cos\phi - \sin\omega t\cos\omega t\sin\phi - \left(\frac{\cos\phi - 1}{2}\right)\right)d\omega t$$

$$\overline{S(t)} = \frac{IV}{2\pi}\left[\frac{2\pi}{2}\right] = \frac{IV}{2}$$

which is the apparent power $\overline{S(t)}$, in VA.

Hence, it is possible to obtain a value of apparent value simply by shifting the level of the power curve P(t) upward until its minimum value is zero and taking the average value of the shifted curve.

In accordance with a preferred embodiment of this invention level shifting circuitry is added to the conventional active power electricity meter of FIG. 1 to carry out the necessary shifting revealed by the aforementioned equations.

Now, referring to FIGS. 2 and 3a–3d, a detailed description of an electricity meter for measuring both active power and apparent power, including level shifting circuitry for providing the necessary shifting of the power curve. To measure active power, the output from the Hall effect watt transducer 10 is applied to switch S1. The output of the averaging circuit (resistors 16 and 22, and capacitor 20) is applied to VCO 25 and the output of VCO 25 is applied to pulse accumulator 30.

To measure apparent power, the output from the Hall effect watt transducer 10 is applied through a switch S2 to level shifting circuitry comprising a closed loop servo including a differential amplifier/buffer circuit 60, a first operational amplifier circuit 40 and a second operational amplifier circuit 50 connected between Hall effect watt transducer 10 and VCO 25a. Differential amplifier/buffer circuit 60 is configured as a summing amplifier and the output signal from Hall effect watt transducer 10 is applied to the inverting input 12 of amplifier 15 through resistor 11. The non-inverting input 17 of amplifier 15 is connected to ground. Resistor 13 is connected as a feedback resistor between the output node 14 of amplifier 15 and inverting input 12.

Figure 3B:
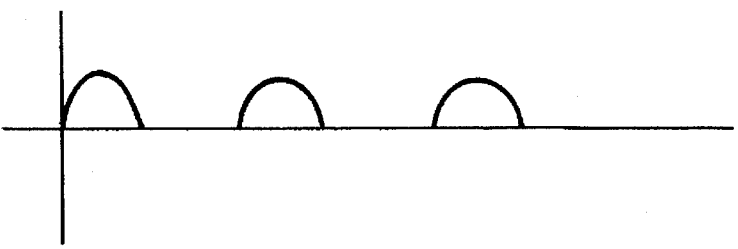
Figure 3C:
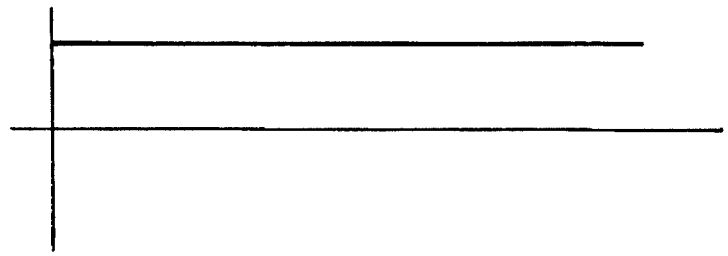
Figure 3D:
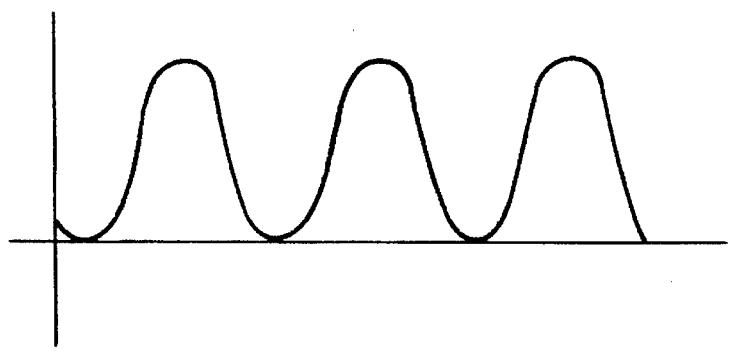

The first operational amplifier circuit 40 is an ideal diode (rectifying amplifier) which senses the negative portion of the power curve and provides a waveform as shown in FIG. 3b. The output of the first operational circuit 40 is integrated by the second operational amplifier circuit 50 and provides a waveform as shown in FIG. 3c. The output of the second operational amplifier 50 is provided to the inverting input 12 of amplifier 15 through resistor 9. The effect of the closed loop level shifting circuitry is to provide at the output node 14 of amplifier 15 the waveform depicted in FIG. 3d. As can be seen, the power curve of FIG. 3a is shifted so that the minimum peak is zero.

This signal is applied through resistor 16a to node 18a which is connected to capacitor 20a and to voltage controlled oscillator (VCO) 25a through resistor 22a. Capacitor 20a is also connected to ground. Resistors 16a and 22a, and capacitor 20a comprise another averaging circuit. The pulse frequency of the pulses from oscillator 25a is proportional to VA and the pulses are accumulated by the pulse accumulator 30a. Alternatively, the pulses from VCO 25a can be sent to a telemetry device 31a for transmitting the pulses to a remote location for accumulation and billing purposes.

Figure 2:
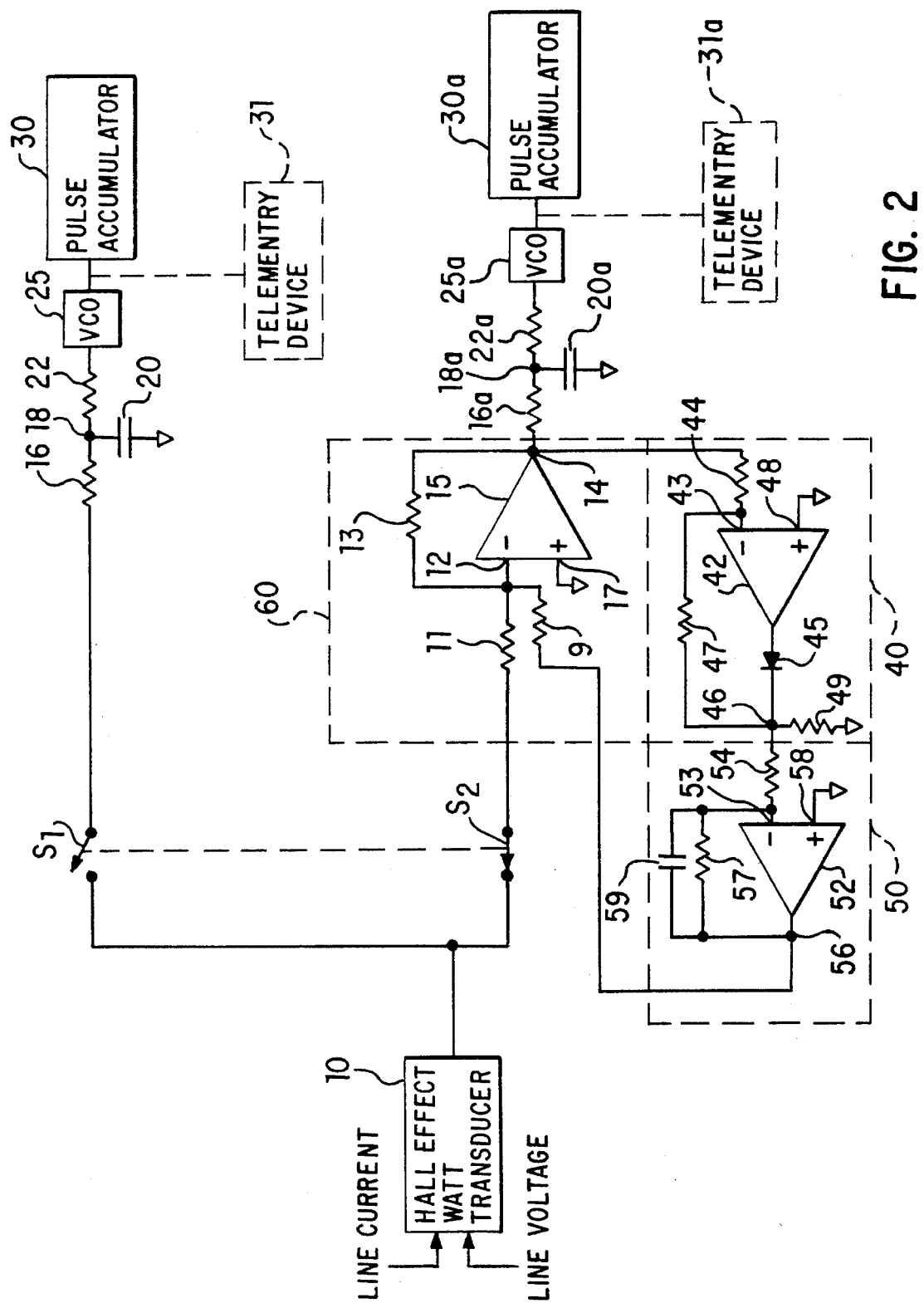
FIG. 2 is a diagram showing level shifting circuitry added to the electricity meter of FIG. 1.

When switch S1 is closed, switch S2 is open and the pulses accumulated in pulse accumulator 30 represent active power in watt-hours. When S2 is closed, switch S1 is open and the pulses accumulated in pulse accumulator 30a represent apparent energy in VA-hours. FIG. 2 shows an arrangement using two switches, but a single switch can be used to measure either active power or apparent power. The embodiment shown in FIG. 2 requires S2 to be open when S1 is closed to measure active power, and S1 to be open when S2 is closed to measure apparent power. Therefore, active power and apparent power are not measured simultaneously. However, it is possible to add a buffer to the output of the Hall effect watt transducer 10 to enable active power and apparent power to be measured simultaneously.

Hence, as described, level shifting circuitry can be incorporated with the conventional FIG. 1 active power meter to shift the level of the active power curve from Hall effect watt transducer 10 at low cost without departing from the conventionality of accepted metering circuitry.

While the invention has been illustrated and described in detail in the drawings and foregoing description, it is clearly understood that the same is to be considered as illustrative and not restrictive in character, it being understood that the spirit and scope of the present invention being limited only by the terms of the appended claims. For example, while the present invention has been described using single phase circuitry, polyphase VA measurement can be achieved by performing identical level shifting and averaging in each phase and summing the results of each.

What is claimed is:

1. An electricity meter for measuring AC power consumption comprising:
   (a) a Hall effect transducer receiving line current and line voltage and providing a first signal proportional to active power;
   (b) a level shifting circuit connected to receive the output of said Hall effect transducer and to provide a level shifted signal, said level shifting circuit comprising:
      (1) a summing means having an input and an output;
      (2) a first operational amplifier circuit and a second operational amplifier circuit, said first and second operational amplifier circuits being connected in series between said input and said output of said summing means;
      (3) said first operational amplifier circuit comprising:
         (a) a first amplifier having a first input connected to receive an output of the summing means, a second input connected to ground, and an output;
         (b) an output node;
         (c) diode connected between said output of said first amplifier and said output node; and
         (d) feedback resistor connected between said first input and said output node; and
      (4) said second operational amplifier circuit comprising:
         (a) a second amplifier having a first input connected to said output node of said first operational amplifier circuit, a second input connected to ground and an output connected to said input of said summing means; and
         (b) a resistor and a capacitor connected in parallel between said first input and said output;
   (c) an averaging means connected to receive the level shifted signal from said level shifting circuit and to provide an average value;
   (d) a pulse providing means connected to receive said averaged value from said averaging means and to provide pulse output signals; and
   (e) a pulse accumulator connected to said output of said pulse providing means for accumulating said pulse signals provided by said pulse providing means, wherein said accumulated pulse signals from said pulse accumulator correspond to apparent energy.

2. The electricity meter according to claim 1, wherein said output device includes a telemetry device.

3. The electricity meter according to claim 1, wherein said first signal from said Hall effect transducer is applied to the input of said summing means through a first resistor, the output of said second amplifier is applied to the input of said summing means through a second resistor, and a third resistor is connected between said input of said summing means and said output of said summing means.

4. An electricity meter for measuring AC power consumption comprising:
   (a) a Hall effect transducer receiving line current and line voltage and providing a signal proportional to active power;
   (b) a voltage-controlled oscillator coupled to the transducer and providing pulse output signals;
   (c) pulse accumulator connected to the voltage-controlled oscillator for accumulating the pulse signals; and
   (d) level shifting circuit having an input connected to receive the signal from the transducer and an output connected to said voltage-controlled oscillator, wherein said level shifting circuit comprises:
      (1) a summing amplifier having at least one input and an output;
      (2) a first operational amplifier circuit comprising:
      and a second operational amplifier circuit connected in series between said input and said output of said summing amplifier;
      (3) said first operational amplifier circuit comprising:
         (a) a first amplifier having a first input connected to receive the output node of the summing amplifier, a second input connected to ground and an output,
         (b) an output node connected to ground through a first resistor,
         (c) a diode connected between the output of the first amplifier and the output node, and
         (d) second resistor connected between the first input and the output node; and
      (4) said second operational amplifier circuit comprising:
         (a) second amplifier having a first input connected to the output node of the first operational amplifier circuit, a second input connected to ground and an output connected to the input of the summing amplifier, and
         (b) a third resistor and a capacitor connected in parallel between said first input and said output,
   wherein said accumulated pulse signals of said pulse accumulator correspond to apparent power.

5. The electricity meter according to claim 4, wherein said summing amplifier has first and second inputs, the signal from the transducer is applied to the first input of said summing amplifier through a fourth resistor, the output of said second amplifier is applied to said first input of said summing amplifier through a fifth resistor, and a sixth resistor is connected between said output and said first input of said summing amplifier, said summing amplifier having said second input connected to ground.

6. The electricity meter according to claim 5, wherein said transducer is a Hall watt transducer.

* * * * *